(12) United States Patent
Iijima

(10) Patent No.: US 8,574,366 B2
(45) Date of Patent: Nov. 5, 2013

(54) VACUUM PROCESSING APPARATUS

(75) Inventor: Eiichi Iijima, Chigasaki (JP)

(73) Assignee: Ulvac, Inc., Chigasaki-Shi (JP)

( * ) Notice: Subject to any disclaimer, the term of this patent is extended or adjusted under 35 U.S.C. 154(b) by 800 days.

(21) Appl. No.: 11/993,783

(22) PCT Filed: Jul. 21, 2006

(86) PCT No.: PCT/JP2006/314454
§ 371 (c)(1),
(2), (4) Date: Feb. 25, 2010

(87) PCT Pub. No.: WO2007/013363
PCT Pub. Date: Feb. 1, 2007

(65) Prior Publication Data
US 2010/0143079 A1  Jun. 10, 2010

(30) Foreign Application Priority Data
Jul. 29, 2005  (JP) .............................. P2005-221099

(51) Int. Cl.
*C23C 16/00* (2006.01)
*H01L 21/677* (2006.01)

(52) U.S. Cl.
USPC ............ 118/719; 414/153; 414/217; 414/939

(58) Field of Classification Search
USPC .......................... 414/153, 217, 939; 118/719
See application file for complete search history.

(56) References Cited

U.S. PATENT DOCUMENTS

| | | | |
|---|---|---|---|
| 5,730,847 A | 3/1998 | Hanaguri et al. | |
| 6,746,239 B2 * | 6/2004 | Takahashi | 432/121 |
| 7,918,940 B2 * | 4/2011 | An et al. | 118/719 |
| 2002/0024647 A1 * | 2/2002 | Nakahara et al. | 355/53 |
| 2002/0150448 A1 * | 10/2002 | Mizokawa et al. | 414/217 |
| 2003/0124764 A1 * | 7/2003 | Yamazaki et al. | 438/99 |
| 2005/0074312 A1 * | 4/2005 | Hwang et al. | 414/217 |
| 2005/0120578 A1 * | 6/2005 | van der Meulen | 34/92 |

FOREIGN PATENT DOCUMENTS

| | | |
|---|---|---|
| JP | 06-340968 | 12/1994 |
| JP | 07-316814 | 12/1995 |
| JP | 8096358 | 4/1996 |
| JP | H09-279341 | 10/1997 |
| JP | 2001-156158 | 6/2001 |
| JP | 2002-176090 | 6/2002 |
| JP | 2002288888 | 10/2002 |
| TW | 499499 | 8/2002 |
| TW | 586176 | 5/2004 |

OTHER PUBLICATIONS

International Search Report mailed Oct. 3, 2006 issued in PCT patent application No. PCT/JP2006/314454, 2 pages.

(Continued)

*Primary Examiner* — Scott Lowe

(74) *Attorney, Agent, or Firm* — Grossman, Tucker, Perreault & Pfleger, PLLC

(57) ABSTRACT

A vacuum processing apparatus includes: a plurality of carriers to be mounted with a base member; a circulation path which is kept in a controlled atmosphere and through which the carriers circulate; a plurality of base member loading and unloading chambers which are disposed in the circulation path and which load and unload the base member to and from the carriers; and a plurality of vacuum processing chambers which are disposed between the base member loading and unloading chambers in the circulation path for performing a vacuum process on the base member.

9 Claims, 10 Drawing Sheets

(56) References Cited

OTHER PUBLICATIONS

Korean Office Action from related Korean Application No. 10-2007-7015049 dated Dec. 16, 2009 with English translation.

Office Action from corresponding Japanese Application No. 2005-221099 dated May 17, 2011. English translation attached.

Office Action from corresponding Taiwanese Application No. 095127143 dated Nov. 12, 2012. English translation of Search Report attached.

* cited by examiner

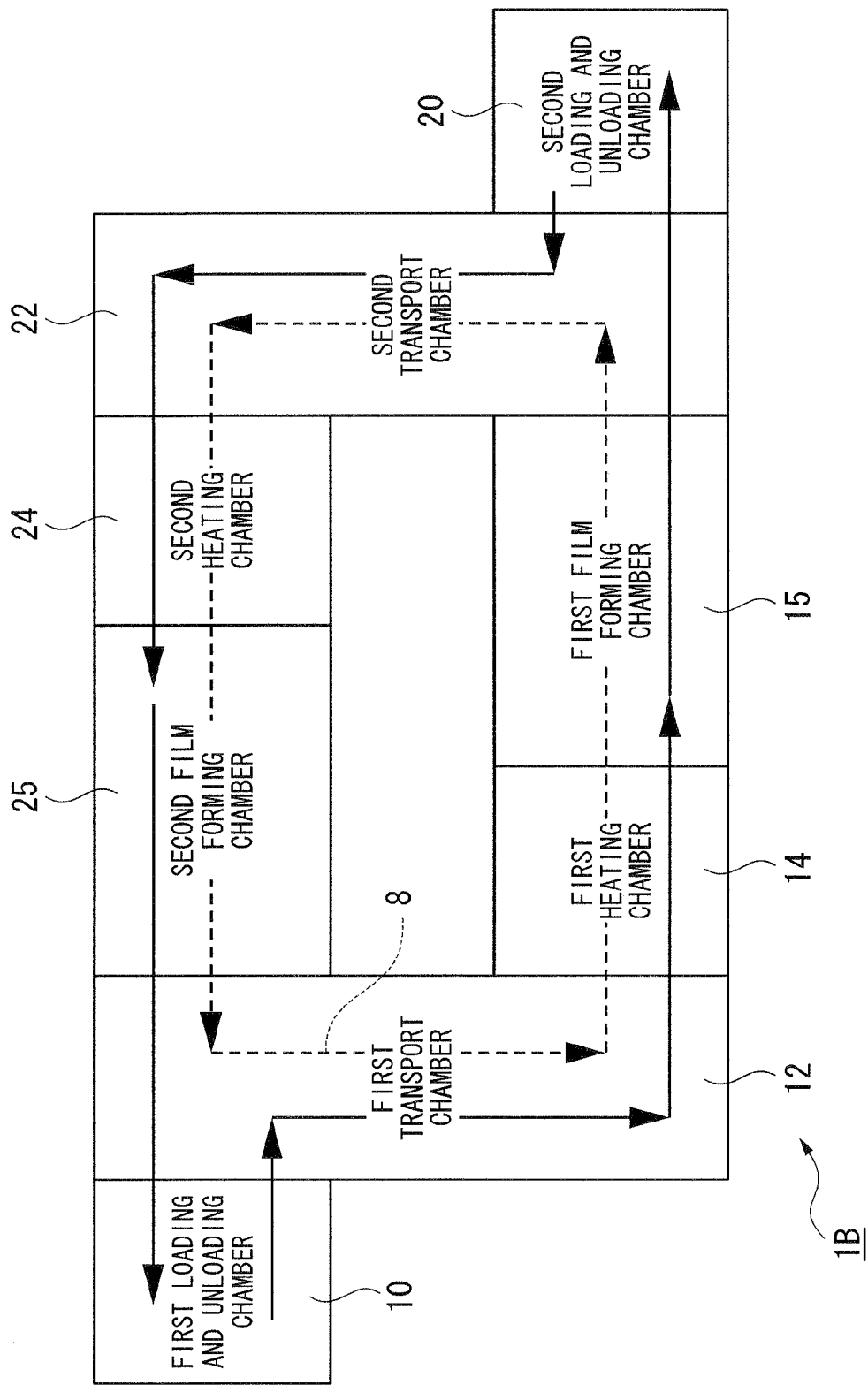

FIG. 7

| | | | | | |
|---|---|---|---|---|---|
| THIRD LOADING AND UNLOADING CHAMBER (30) | THIRD BUFFER (32) | THIRD HEATING CHAMBER (34) | | | |
| | | THIRD FILM FORMING CHAMBER (35) | | SECOND FILM FORMING CHAMBER (25) | SECOND LOADING AND UNLOADING CHAMBER (20) |
| | | | | SECOND HEATING CHAMBER (24) | SECOND BUFFER (22) |
| FOURTH LOADING AND UNLOADING CHAMBER (40) | FOURTH BUFFER (42) | FOURTH HEATING CHAMBER (44) | FOURTH FILM FORMING CHAMBER (45) | FIRST FILM FORMING CHAMBER (15) | |
| | | | FIRST BUFFER (12) | FIRST HEATING CHAMBER (14) | FIRST LOADING AND UNLOADING CHAMBER (10) |

1C

VACUUM PROCESSING APPARATUS

TECHNICAL FIELD

The present invention relates to a vacuum processing apparatus.

Priority is claimed on Japanese Patent Application No. 2005-221099, filed on Jul. 29, 2005, the contents of which are incorporated herein by reference.

BACKGROUND ART

In plasma display panels, an MgO film is used as a protective layer of electrodes and dielectrics. A vacuum processing apparatus such as a deposition apparatus is used to form the MgO film.

FIG. 11 is a plan view schematically illustrating a configuration of a known vacuum processing apparatus. The vacuum processing apparatus 100 includes a heating chamber 114 for heating a processing substrate and a film forming chamber 115 for forming the MgO film on the substrate after heating. The substrate is mounted on a carrier and a plurality of carriers are sequentially moved to processing chambers while the substrates are sequentially subjected to the processes.

In the film forming chamber 115, a part of the MgO film is formed on the carrier as well as the substrate. The MgO film has a feature that it easily adsorbs moisture or carbon acid gas in the atmospheric air. The moisture adsorbed by the MgO film cannot be easily removed. Accordingly, in the case in which the carrier enters the film forming chamber 115, MgO is gasified (evaporated) by heating to destabilize the degree of vacuum of the film forming chamber 115. In the case in which the degree of vacuum of the film forming chamber 115 is destabilized, the crystal orientation of the MgO film formed on the substrate is destabilized. This is because the coexisting ratio of a (111) crystal orientation component and a (200) crystal orientation component of the MgO film varies due to the pressure at the time of forming a film; and permeability of the MgO film is also destabilized. On the other hand, in the case in which the carbon acid gas ($CO_2$, CO) is adsorbed by MgO, C infiltrates the MgO film to lower cathode luminescence intensity. That is, C infiltrating the MgO film deteriorates a discharge characteristic of the plasma display panel.

Therefore, there was suggested a technique of preventing the moisture or the carbon acid gas from being adsorbed by the MgO film formed on the carrier by keeping the movement passage of the carrier in a vacuum state and loading and unloading the substrate to and from the carrier through a load lock chamber (for example, see Patent Document 1). In the vacuum processing apparatus shown in FIG. 11, a return transport passage (a second transport chamber 92, a third transport chamber 93, and a first transport chamber 112) of the carrier is formed from the outlet of the film forming chamber 115 to the inlet of the heating chamber 114. The transport passage, the heating chamber 114, and the film forming chamber 115 are kept in a vacuum state, thereby forming a vacuum circulation path 108 of a plurality of carriers. The first transport chamber 112 is provided with a substrate loading and unloading chamber 110 for the carrier. In the substrate loading and unloading chamber 110, before-processing substrates are loaded to the carriers circulating the vacuum circulation path 108 and after-processing substrates are unloaded from the carriers.

[Patent Document 1] Japanese Unexamined Patent Application, First Publication No. H09-279341

[Patent Document 2] Japanese Unexamined Patent Application, First Publication No. 2001-156158

DISCLOSURE OF THE INVENTION

Problems to be Solved by the Invention

However, since the return transport passage of the carrier does not contribute to the production activity, an extra space for installing apparatuses is required and thus much cost of equipment is required.

Accordingly, there was suggested a technique of providing a film forming chamber or other processing chambers to the return transport passage (for example, see Patent Document 2). However, the tact time for processing a substrate in the above-mentioned vacuum processing apparatus is regulated by the loading and unloading time of a substrate, thereby limiting an improvement in throughput.

The present invention is contrived to solve the above-mentioned problems. An object of the present invention is to provide a vacuum processing apparatus which can improve throughput.

Means for Solving the Problems

In order to achieve the above-mentioned object, according to an aspect of the invention, there is provided a vacuum processing apparatus including: a plurality of carriers to be mounted with a base member; a circulation path which is kept in a controlled atmosphere and through which the carriers move; a plurality of base member loading and unloading chambers which are disposed in the circulation path and which loads and unloads the base member to and from the carriers; and a vacuum processing chamber which is disposed between the base member loading and unloading chambers in the circulation path and which performs a vacuum process to the base member.

A heating chamber for heating the base member may be disposed on upstream sides of the vacuum processing chambers in the circulation path.

A cooling chamber for cooling the base member may be disposed on downstream sides of the vacuum processing chambers in the circulation path.

Here, the "controlled atmosphere" means an atmosphere in which partial pressures of the moisture and the carbon acid gas are suppressed, that is, a vacuum state, CDA (Clean Dry Air), or an atmosphere of inert gas such as $N_2$.

In the past, a base member was loaded to a carrier in the base member loading and unloading chamber, the base member was subjected to a vacuum process by the vacuum processing chamber, and then the base member was unloaded from the carrier in the same base member loading and unloading chamber. That is, one processing system was formed by one circulation path. On the contrary, according to the configuration of the present invention, a base member is loaded to a carrier in the first base member loading and unloading chamber, the base member is subjected to a vacuum process by the first vacuum processing chamber, and then the base member is unloaded from the carrier in the second base member loading and unloading chamber. At the same time, a base member is loaded to another carrier in the second base member loading and unloading chamber, the base member is subjected to a vacuum process by the second vacuum processing chamber, and then the base member is unloaded from the carrier in the third base member loading and unloading chamber. In this way, a plurality of processing systems are formed along one circulation path and the base members can be simultaneously processed by the processing systems. Accordingly, even when the tact time for processing a base member is regulated by the loading and unloading time, it is possible to improve throughput by simultaneously processing the base members by the use of the plurality of processing systems, compared with the known case where the base member is processed by only one processing system.

The vacuum processing chambers may include a first vacuum processing chamber and a second vacuum processing chamber. Here, the first vacuum processing chamber and the second vacuum processing chamber may be disposed to perform different processes.

According to this configuration, it is possible to cope with plural kinds of products appropriately, thereby improving the throughput.

The vacuum processing chambers may include a first vacuum processing chamber and a second vacuum processing chamber. A transport chamber of the base member may be disposed on a downstream side of the first vacuum processing chamber and on an upstream side of the second vacuum processing chamber in the circulation path. The base member loading and unloading chambers may be disposed on an end of the transport chamber close to the second vacuum processing chamber.

The transport chamber may serve as a cooling chamber for cooling the base member before it is processed by the second vacuum processing chamber.

The transport chamber serves as a heating chamber for heating the base member before it is processed by the second vacuum processing chamber.

According to these configurations, almost the entire vacuum circulation path can be used for production, thereby improving the throughput.

A base member unloading chamber and a base member loading chamber may be divided as the base member loading and unloading chamber.

According to this configuration, the unloading of a base member from one carrier in the base member unloading chamber and the loading of a base member to another carrier in the base member loading chamber can be simultaneously performed by the use of the circulating carriers. Compared with a case where a base member is unloaded from one carrier in the base member loading and unloading chamber and then a base member is loaded to the same carrier, it is possible to shorten the tact time.

Accordingly, it is possible to improve the throughput.

Effects of the Invention

In the vacuum processing apparatus according to the present invention, a plurality of processing systems are formed along one circulation path and the base members can be simultaneously processed by the processing systems. Accordingly, even when the tact time for processing a base member is regulated by the loading and unloading time, it is possible to improve throughput by simultaneously processing the base member by the use of the plurality of processing systems, compared with the known case where the base member is processed by only one processing system.

BRIEF DESCRIPTION OF THE DRAWINGS

FIG. 6 is a plan view showing a schematic configuration of a vacuum processing apparatus according to a second embodiment of the present invention.

FIG. 7 is a plan view showing a schematic configuration of a vacuum processing apparatus according to a third embodiment of the present invention.

REFERENCE SYMBOLS 1, 1B, 1C, 1D, 1E, 1F: vacuum processing apparatus
8: vacuum circulation path (circulation path)
10: first loading and unloading chamber (base member loading and unloading chamber)
11: first loading chamber (loading chamber)
12: first transport chamber (transport chamber)
14: first heating chamber (heating chamber)
15: first film forming chamber (vacuum processing chamber)
16: first cooling chamber (cooling chamber)
19: first unloading chamber (unloading chamber)
20: second loading and unloading chamber (base member loading and unloading chamber)
21: second loading chamber (loading chamber)
22: second transport chamber (transport chamber)
24: second heating chamber (heating chamber)
25: second film forming chamber (vacuum processing chamber)
26: second cooling chamber (cooling chamber)
29: second unloading chamber (unloading chamber)
30: third loading and unloading chamber (base member loading and unloading chamber)
34: third heating chamber (heating chamber)
35: third film forming chamber (vacuum processing chamber)
40: fourth loading and unloading chamber (base member loading and unloading chamber)
44: fourth heating chamber (heating chamber)
45: fourth film forming chamber (vacuum processing chamber)
50: carrier

BEST MODE FOR CARRYING OUT THE INVENTION

Hereinafter, embodiments of the present invention will be described with reference to the drawings. Throughout the figures used in the following description, layers and members are scaled to a perceivable size.

Although it is exemplified in the following description that an MgO film is formed as a protective layer of an electrode and a dielectric of a plasma display panel, the present invention may be applied to formation of other films.

(First Embodiment)

A vacuum processing apparatus according to a first embodiment of the present invention will be first described.

Figure 1:
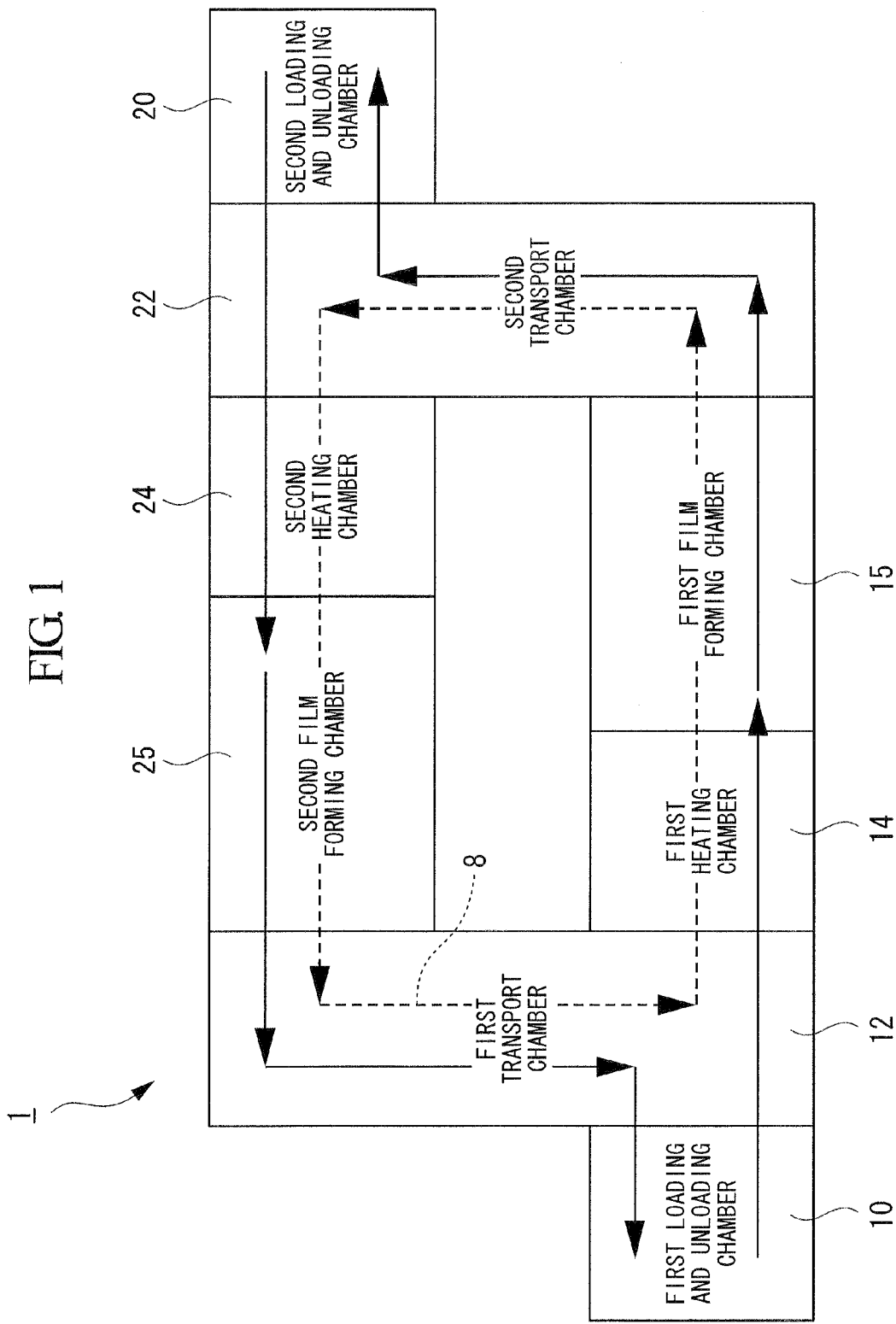
FIG. 1 is a plan view showing a schematic configuration of a vacuum processing apparatus according to a first embodiment of the present invention.

FIG. 1 is a plan view schematically showing a vacuum processing apparatus according to the first embodiment of the present invention. A vacuum processing apparatus 1 according to the first embodiment includes a vacuum circulation path (circulation path) 8 of a carrier for holding a substrate, a first loading and unloading chamber (base member loading and unloading chamber) 10 and a second loading and unloading chamber (base member loading and unloading chamber) 20 for loading and unloading a substrate to and from the carrier, a first film forming chamber (vacuum processing chamber) 15 disposed in the vacuum circulation path 8 extending from the first loading and unloading chamber 10 to the second loading and unloading chamber 20, and a second film forming chamber (vacuum processing chamber) 25 disposed in the vacuum circulation path 8 extending from the second loading and unloading chamber 20 to the first loading and unloading chamber 10. A first transport chamber (transport chamber) 12 is disposed on a downstream side of the second film forming chamber 25 and on an upstream side of the first film forming chamber 15 in the vacuum circulation path 8 and the first loading and unloading chamber 10 is disposed at an end of the first transport chamber 12 close to the first film forming chamber 15.

(Vacuum Processing Apparatus)

The vacuum processing apparatus 1 has a carrier for holding a substrate (base member).

Figure 2:
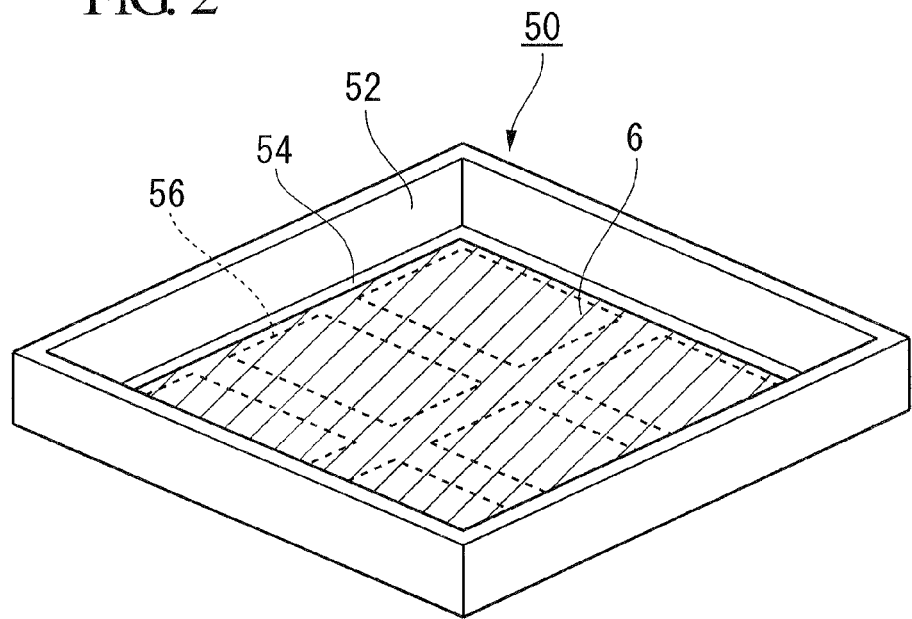
FIG. 2 is a perspective view showing a carrier in the vacuum processing apparatus.

FIG. 2 is a perspective view of the carrier. A carrier 50 having an inner frame 54 inside an outer frame 52 and a window portion 56 is formed in the inner frame 54. A substrate 6 can be mounted on the carrier 50 with the substrate 6 exposed from the window portion 56 from the window portion 56 by placing the substrate 6 on the inner frame 54. FIG. 2 shows a case where six window portions 56 are formed in the inner frame 54 and a substrate 6 as a sheet of mother glass is mounted on the carrier 50. One sheet of panel or plural sheets of panel can be taken out of the mother glass by performing the following processes through one or plural window portions 56 formed in the inner frame 54.

As shown in FIG. 1, the vacuum processing apparatus 1 includes the first film forming chamber 15.

Figure 3:
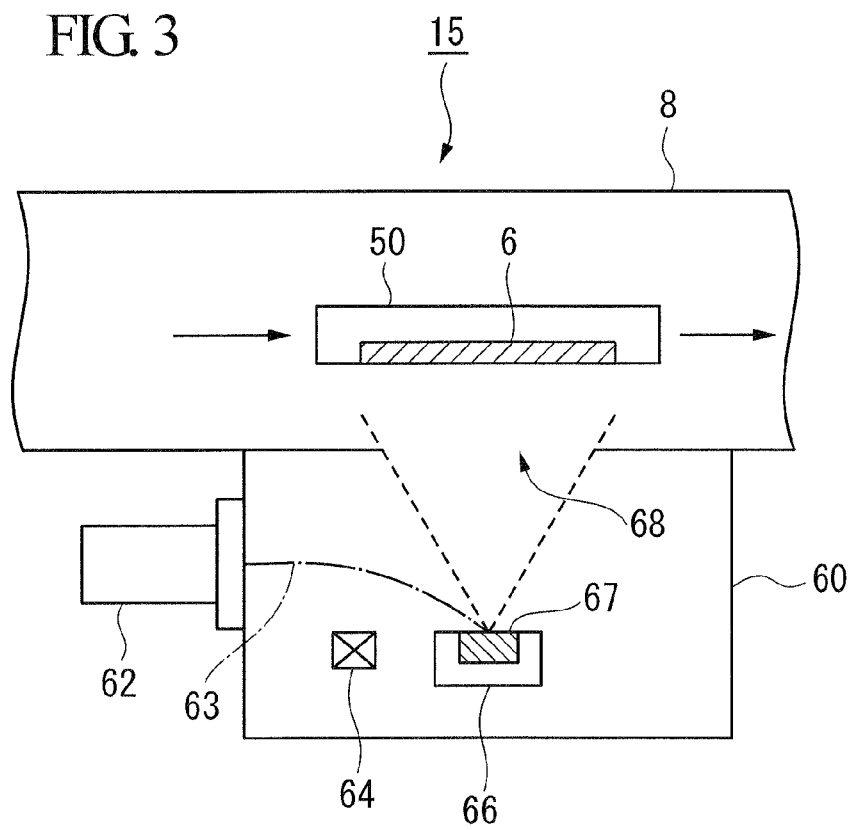
FIG. 3 is a side sectional view showing a schematic configuration of a first film forming chamber in the vacuum processing apparatus.

FIG. 3 is a side sectional view illustrating a schematic configuration of the first film forming chamber. The first film forming chamber 15 includes a deposition chamber 60 below the vacuum circulation path 8. An electron beam emitting device 62 is disposed on a side surface of the deposition chamber 60. A deflecting coil 64 and a hearth 66 are disposed in the deposition chamber 60. An electron beam 63 is emitted from the electron beam emitting device 62, and the locus thereof is deflected by the deflecting coil 64 and is incident on the hearth 66. As a result, a film forming material 67 such as MgO filled in the hearth 66 is heated and evaporated. The evaporated film forming material 67 passes through a window portion 68 of the vacuum circulation path 8 and is attached to the substrate 6 mounted on the carrier 50. Accordingly, the substrate 6 is subjected to a film forming process. The film forming process may be performed by the film forming chamber not only on one carrier 50 but also on a plurality of carriers transported continuously.

As shown in FIG. 1, a first heating chamber (heating chamber) 14 is disposed adjacent to the first film forming apparatus 15. The first heating chamber 14 serves to heat the substrate prior to the film forming process and heaters or the like are arranged opposite to the front and rear surfaces of the substrate.

A second heating chamber (heating chamber) 24 and the second film forming chamber (vacuum processing chamber) 25 configured similarly are disposed adjacent to the first heating chamber 14 and the first film forming chamber 15. The first transport chamber 12 is disposed from the second film forming chamber 25 to the first heating chamber 14 and a second transport chamber (transport chamber) 22 is disposed from the first film forming chamber 15 to the second heating chamber 24. The chambers are all kept in a vacuum and the carrier is circulated therein. That is, the vacuum circulation path 8 of the carrier is formed by the chambers.

On the other hand, the first loading and unloading chamber 10 is connected to the first transport chamber 12. The first loading and unloading chamber 10 is used to load and unload a substrate to and from the carrier and has a robot and the like (not shown). The first loading and unloading chamber 10 serves as a load lock chamber for the vacuum circulation path 8. The first loading and unloading chamber 10 includes a vacuum pump and is connected to the first transport chamber 12 through a valve. Similarly, the second loading and unloading chamber 20 is connected to the second transport chamber 22.

In this way, a plurality of substrate loading and unloading chambers are disposed in the vacuum circulation path 8. The first film forming chamber 15 is disposed in the vacuum circulation path 8 extending from the first loading and unloading chamber 10 to the second loading and unloading chamber 20 and the second film forming chamber 25 is disposed in the vacuum circulation path 8 extending from the second loading and unloading chamber 20 to the first loading and unloading chamber 10. Other vacuum processing chambers may be provided instead of the first film forming chamber 15 and the second film forming chamber 25. For example, a surface processing chamber for the MgO film may be provided instead of the second film forming chamber 25.

The first transport chamber 12 according to the first embodiment serves as a cooling chamber for the substrate having been subjected to the film forming process by the second film forming chamber 25. Accordingly, the first loading and unloading chamber 10 is connected to a downstream end (close to the first film forming chamber 15) of the first transport chamber 12. Specifically, the downstream end is an end (an end opposite to the first heating chamber 14 in the example shown in FIG. 1) other than a connection portion to the first heating chamber 14. Similarly, the second loading and unloading chamber 20 is connected to a downstream end (close to the second film forming chamber 25) of the second transport chamber 22. Specifically, the downstream end is an end (an end opposite to the second heating chamber 24 in the example shown in FIG. 1) other than a connection portion to the second heating chamber 24.

(Substrate Distributing System)

Figure 4:
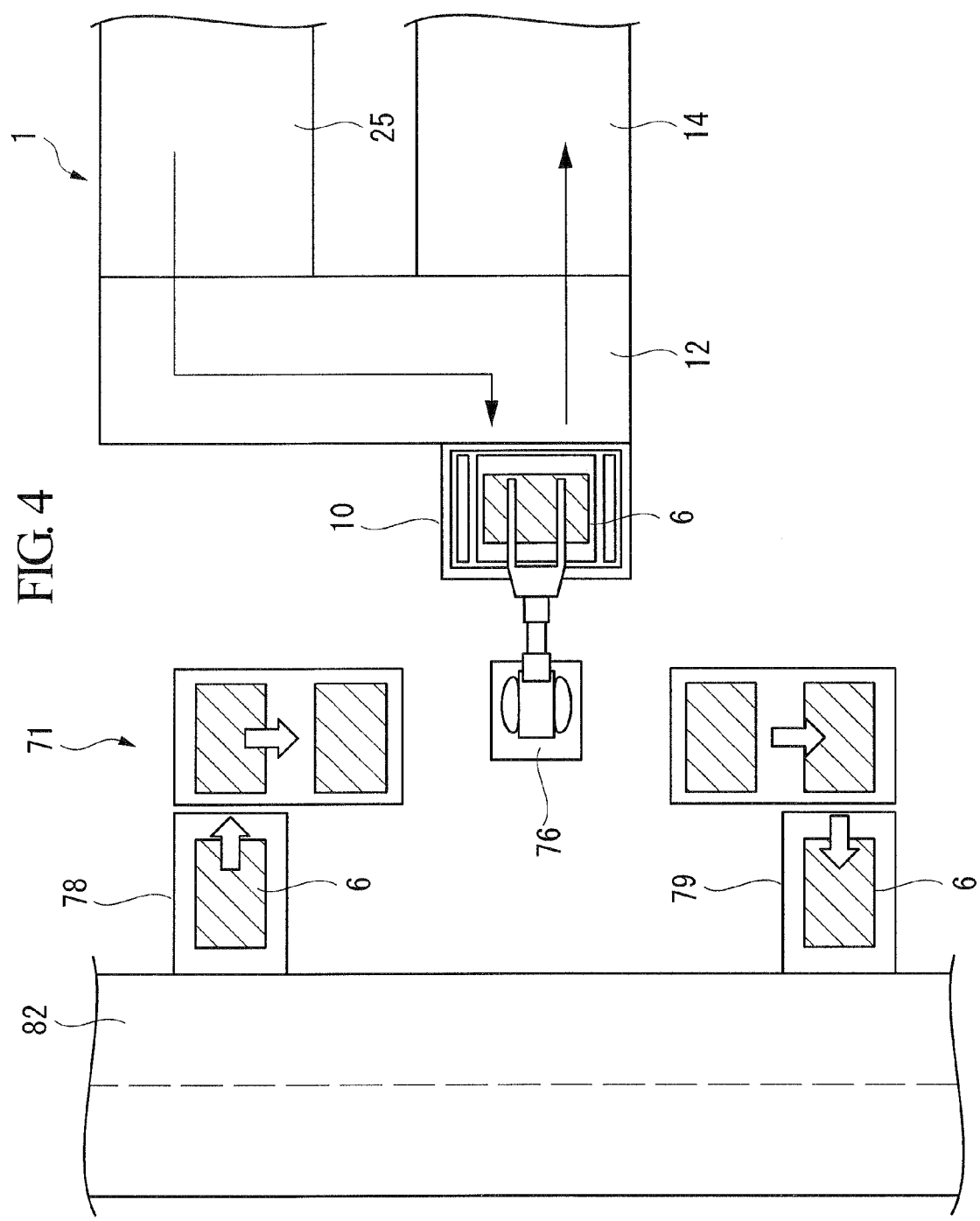
FIG. 4 is a plan view showing a schematic configuration of a substrate distributing system including the vacuum processing apparatus.
Figure 5:
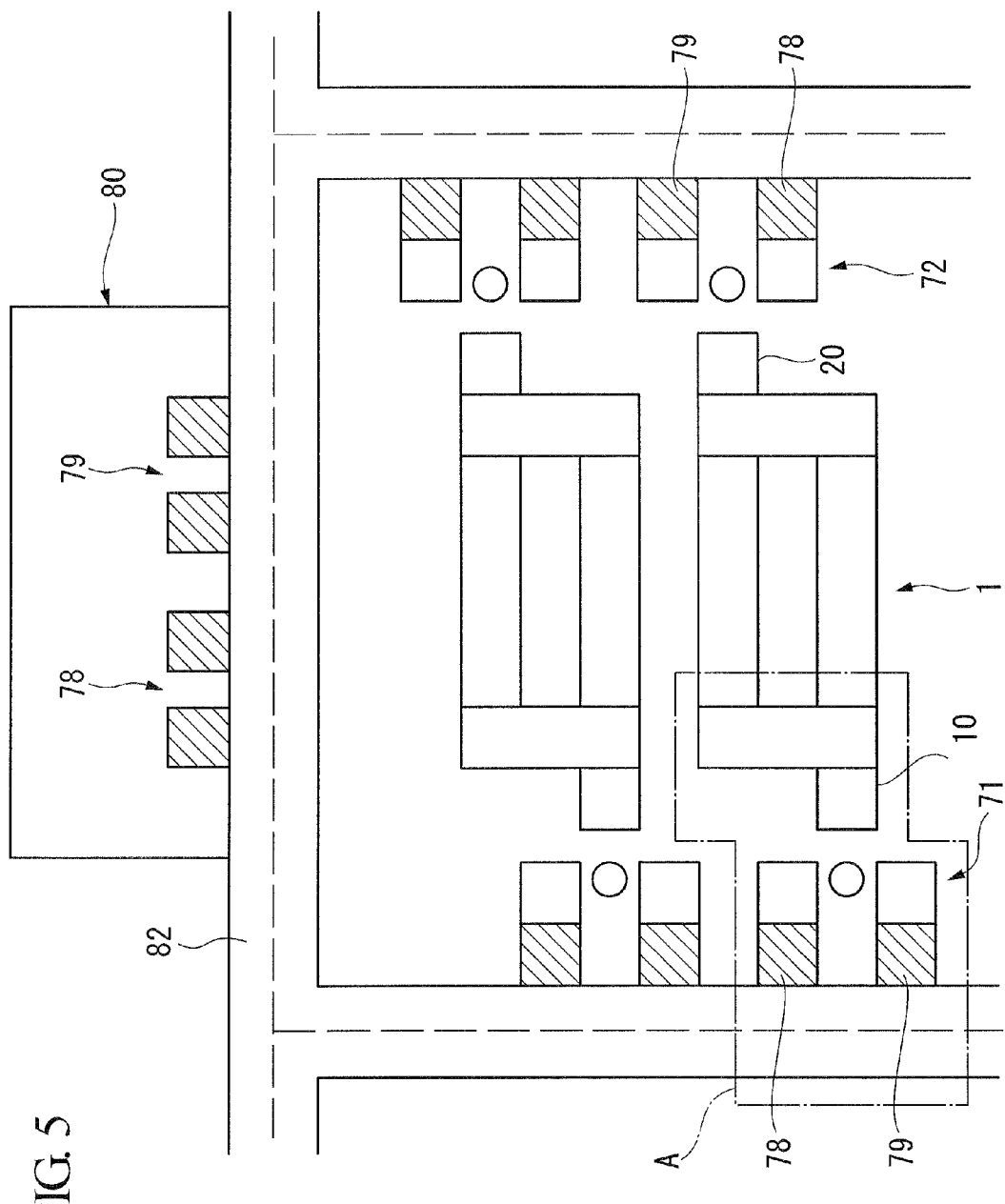
FIG. 5 is a plan view showing a schematic configuration of the substrate distributing system including the vacuum processing apparatus.

FIGS. 4 and 5 are plan views schematically showing a configuration of a substrate distributing system including the vacuum processing apparatus 1. FIG. 4 is an enlarged view of a part A of FIG. 5 and FIG. 5 is an entire diagram. As shown in FIG. 4, a first substrate supply apparatus 71 is disposed on a side of the first loading and unloading chamber 10 in the vacuum processing apparatus 1. The first substrate supply apparatus 71 includes a substrate transport robot 76. The first substrate supply apparatus 71 is supplied with a before-processing substrate rack 78 and an after-processing substrate rack 79.

A plurality of before-processing substrates 6 are mounted on the before-processing substrate rack 78 with processing surfaces of the substrates facing upward. The substrate 6 is unloaded from the before-processing substrate rack 78 and the substrate supply robot 76 adsorbs the substrate 6 and inverts the substrate 6 so that the processing surface is directed downward. The inverted substrate 6 is supplied to the first loading and unloading chamber 10 of the vacuum processing apparatus 1.

The substrate transport robot 76 adsorbs the after-processing substrate 6 unloaded to the first loading and unloading chamber 10 and inverts the substrate 6 so that the processing surface of the substrate is directed upward. The inverted substrate 6 is placed on the after-processing substrate rack 79. The after-processing substrate rack 79 can mount a plurality of after-processing substrates 6 thereon.

As shown in FIG. 5, the first substrate supply apparatus 71 is disposed on one side of the first loading and unloading chamber 10 in the vacuum processing apparatus 1. A second substrate supply apparatus 72 having the same structure is disposed in one side of the second loading and unloading chamber 20. The substrate supply apparatuses 71 and 72 are adjacent to a passage 82 of an automatic guided vehicle (AGV) and the passage 82 communicates with a rack storage 80.

The rack storage 80 temporarily stores the before-processing substrate rack 78 transported from a previous process and the after-processing substrate rack 79 to be transported to a subsequent process.

The AGV takes the before-processing substrate rack 78 out of the rack storage 80 and feeds the removed before-processing substrate rack to the first substrate supply apparatus 71. The AGV receives one after-processing substrate rack 79 from the first substrate supply apparatus 71 and feeds the received after-processing substrate rack to the rack storage 80. Then, the AGV takes another before-processing substrate rack 78 out of the rack storage 80 and feeds the removed before-processing substrate rack to the second substrate supply apparatus 72. The AGV receives another after-processing substrate rack 79 from the second substrate supply apparatus 72 and feeds the received after-processing substrate rack 79 to the rack storage 80. A substrate distributing system extending from the previous process to the subsequent process through the vacuum process is configured as described above.

Another substrate distributing system may be employed. For example, a rack supply conveyor extending from a previous process is branched and connected to the first substrate supply apparatus 71 and the second substrate supply apparatus 72, and a rack discharge conveyor extending from the first substrate supply apparatus 71 and the second substrate supply apparatus 72 are merged and connected to a subsequent process.

(Vacuum Processing Method)

A vacuum processing method using the vacuum processing apparatus 1 according to this embodiment will be described with reference to FIG. 1. First, a before-processing substrate is loaded to the carrier in the vacuum circulation path 8 from the first loading and unloading chamber 10. The substrate is subjected to a heating process by the first heating chamber 14, is subjected to a film forming process by the first film forming chamber, and then is subjected to a cooling process by the second transport chamber 22. The after-processing substrate is unloaded to the second loading and unloading chamber 20 from the carrier in the vacuum circulation path 8.

At the same time, another before-processing substrate is loaded to the carrier in the vacuum circulation path 8 from the second loading and unloading chamber 20. The substrate is subjected to a heating process by the second heating chamber 24, is subjected to a film forming process by the second film forming chamber, and is subjected to a cooling process by the first transport chamber 12. The after-processing substrate is unloaded to the first loading and unloading chamber 10 from the carrier in the vacuum circulation path 8. In this way, the vacuum processing apparatus according to this embodiment has two processing systems formed along the vacuum circulation path 8.

The second film forming chamber 25 may perform the film forming process under conditions different from those of the first film forming chamber 15. That is, the film forming process with the conditions different in film forming temperature, pressure, process gas, film forming speed, and the like may be performed. For example, an MgO film of (111) orientation may be formed by the first film forming chamber 15 and an MgO film of (220) orientation may be formed by the second film forming chamber 25. The first film forming chamber 15 and the second film forming chamber 25 may perform the film forming process on substrates having different thicknesses.

The first film forming chamber 15 and/or the second film forming chamber 25 may perform a process other than the film forming process.

The vacuum processing apparatus 1 according to this embodiment is configured to include the first loading and unloading chamber 10 and the second loading and unloading chamber 20 for loading and unloading a substrate to and from a carrier, the first film forming chamber 15 disposed in the vacuum circulation path 8 extending from the first loading and unloading chamber 10 to the second loading and unloading chamber 20, and the second film forming chamber 25 disposed in the vacuum circulation path 8 extending from the second loading and unloading chamber 20 to the first loading and unloading chamber 10. According to this configuration, two processing systems are formed along one circulation path and the base members can be simultaneously processed by the processing systems. Accordingly, even when the tact time for processing a base member is regulated by the loading and unloading time, it is possible to improve throughput by simultaneously processing the base members by the use of two processing systems, compared with the known case where a base member is processed by only one processing system.

In the vacuum processing apparatus 1 according to this embodiment, the first transport chamber 12 serves as a cooling chamber and the first loading and unloading chamber 10 is connected to the downstream end of the first transport chamber 12. According to this configuration, almost the entire vacuum circulation path can be used for the production activity, thereby improving the throughput.

It is also possible to realize a space saving and reduce installation cost of the vacuum processing apparatus.

In the vacuum processing apparatus 1 according to this embodiment, the first film forming chamber 15 and the second film forming chamber 25 may perform film forming processes under different film forming conditions. For example, the first film forming chamber 15 may perform a first film forming process to produce a first product and the second film forming chamber 25 may perform a second film forming process to produce a second product. In the case in which it is intended to produce only the first product, the second film forming process of the second film forming chamber 25 may be stopped and the first film forming process may be performed by only the first film forming chamber 15.

In this case, the second film forming chamber 25 can be allowed to serve as a mere vacuum transport path. In the case in which it is intended to increase the amount of first product to be produced, the film forming condition of the second film forming chamber 25 may be changed equal to the film forming condition of the first film forming chamber 15 and the first film forming process may be performed by both film forming chambers. On the contrary, in the case in which it is intended to regulate the production of the first product, a maintenance cycle of the first film forming chamber and the second film forming chamber may be doubled by alternately using the first film forming chamber and the second film forming chamber. In this way, in the vacuum processing apparatus according to this embodiment, it is possible to handle multiple kinds of products. Even when a film forming process needs to be performed just before a subsequent process, it is possible to efficiently perform the film forming process in suitable timing and amount.

In the case in which the same kind of film is formed by the first film forming chamber 15 and the second film forming chamber 25, the film formed on the carrier in one film forming chamber hardly has a bad influence on the film forming process in the other film forming chamber. In the case in which the contamination due to different kinds of films causes no problem, different kinds of films may be formed by the first film forming chamber 15 and the second film forming chamber 25.

(Second Embodiment)

FIG. 6 is a plan view showing a schematic configuration of a vacuum processing apparatus according to a second embodiment of the present invention. The descriptions of the same elements as the first embodiment are omitted.

The first transport chamber 12 of a vacuum processing apparatus 1B according to the second embodiment serves as a heating chamber for heating a substrate prior to a film forming process in the first film forming chamber 15. Accordingly, the first loading and unloading chamber 10 is connected to an upstream end (close to the second film forming chamber 25) of the first transport chamber 12. Similarly, the second loading and unloading chamber 20 is connected to an upstream end (close to the first film forming chamber 15) of the second transport chamber 22. According to this configuration, similarly to the first embodiment, almost the entire vacuum circulation path can be used for production activity, thereby improving the throughput. It is also possible to realize space saving and reduce installation cost of the vacuum processing apparatus.

Since the first transport chamber 12 can serve as a heating chamber, two heating chambers including the first heating chamber 14 can be disposed on the upstream side of the first film forming chamber 15. In this case, for example, the substrate temperature in the first transport chamber 12 is raised from 70° C. to 180° C. and the substrate temperature is raised from 180° C. to 250° C. in the first heating chamber 14. By distributing the heating process in this way, it is possible to shorten the tact time and improve the throughput, and the heater's burden can be reduced.

(Third Embodiment)

FIG. 7 is a plan view showing a schematic configuration of a vacuum processing apparatus according to a third embodiment of the present invention. The descriptions of the same elements as the above-mentioned embodiments are omitted.

In a vacuum processing apparatus 1C according to the third embodiment, four sets of heating chambers (the first heating chamber 14, a second heating chamber 24, a third heating chamber 34, and a fourth heating chamber 44) and film forming chambers (the first film forming chamber 15, the second film forming chamber 25, a third film forming chamber 35, and a fourth film forming chamber 45) are connected to each other through buffers 12, 22, 32, and 42, thereby forming a vacuum circulation path. The four buffers are connected to substrate loading and unloading chambers (base member loading and unloading chambers) 10, 20, 30, and 40, respectively. Accordingly, the heating chambers and the film forming chambers are disposed in the vacuum circulation path (not shown in FIG. 7) between four base member loading and unloading chambers.

The vacuum processing apparatus 1C according to the third embodiment can have the same advantages as the first embodiment and can process more substrates in the same tact time; thus, it is possible to further improve the throughput compared with that of the first embodiment.

Although it has been described in the first embodiment that two sets of substrate loading and unloading chambers, heating chambers and film forming chambers are provided and it has been described in the second embodiment that four sets of substrate loading and unloading chambers, heating chambers, and film forming chambers are provided, three sets or five or more sets of substrate loading and unloading chambers, heating chambers, and film forming chambers may be provided.

(Fourth Embodiment)

Figure 8:
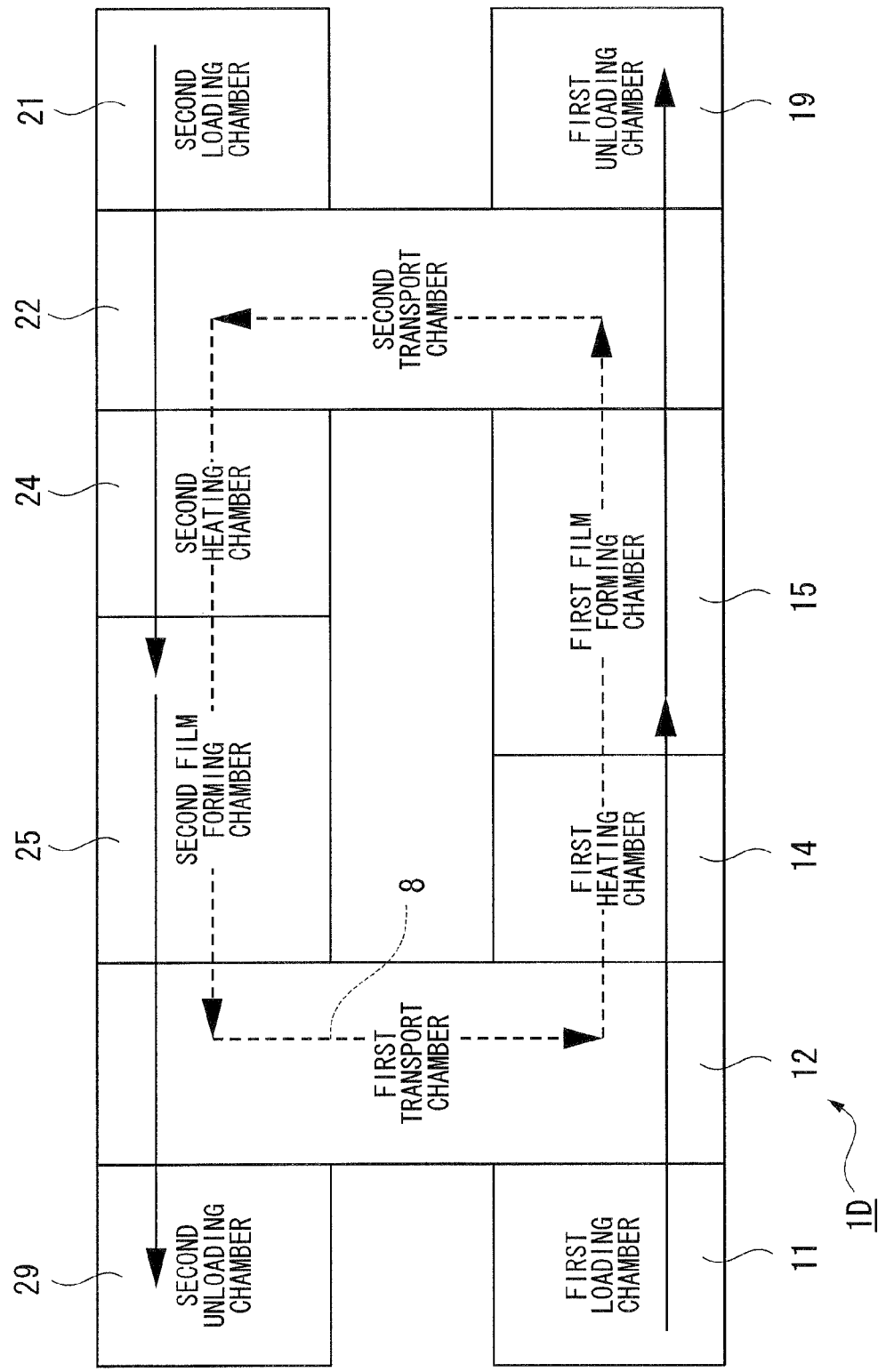
FIG. 8 is a plan view showing a schematic configuration of a vacuum processing apparatus according to a fourth embodiment of the present invention.

FIG. 8 is a plan view showing a schematic configuration of a vacuum processing apparatus according to a fourth embodiment of the present invention. The descriptions of the same elements as the above-mentioned embodiments are omitted.

In a vacuum processing apparatus 1D according to the fourth embodiment, a loading chamber for a before-processing substrate and an unloading chamber for an after-processing substrate are independently provided as a substrate loading and unloading chamber. The substrate loading chamber serves as a load lock chamber and the substrate unloading chamber serves as an unload lock chamber. Accordingly, the substrate loading chamber and the substrate unloading chamber have a vacuum pump and communicate with a transport chamber through a valve.

In the vacuum processing apparatus 1D according to the fourth embodiment, a first loading chamber (base member loading chamber) 11 and a second unloading chamber (unloading chamber) 29 are connected to the first transport chamber 12 and a first unloading chamber (unloading chamber) 19 and a second loading chamber (loading chamber) 21 are connected to the second transport chamber 22. A substrate loaded from the first loading chamber 11 is unloaded to the first unloading chamber 19 through the first heating chamber 14 and the first film forming chamber 15. A substrate loaded from the second loading chamber 21 is unloaded to the second unloading chamber 29 through the second heating chamber 24 and the second film forming chamber 25.

In the vacuum processing chamber 1D according to the fourth embodiment, the unloading of a base member from one carrier in the base member unloading chamber and the loading of a base member to another carrier in the base member loading chamber can be simultaneously performed by the use of the circulating carriers since the substrate loading chamber and the substrate unloading chamber are separated. Accordingly, it is possible to shorten the tact time, compared with the vacuum processing chamber 1 according to the first embodiment in which a base member is unloaded from a carrier in the base member loading and unloading chamber and then a base member is loaded to the same carrier. Therefore, it is possible to improve the throughput.

(Fifth Embodiment)

Figure 9:
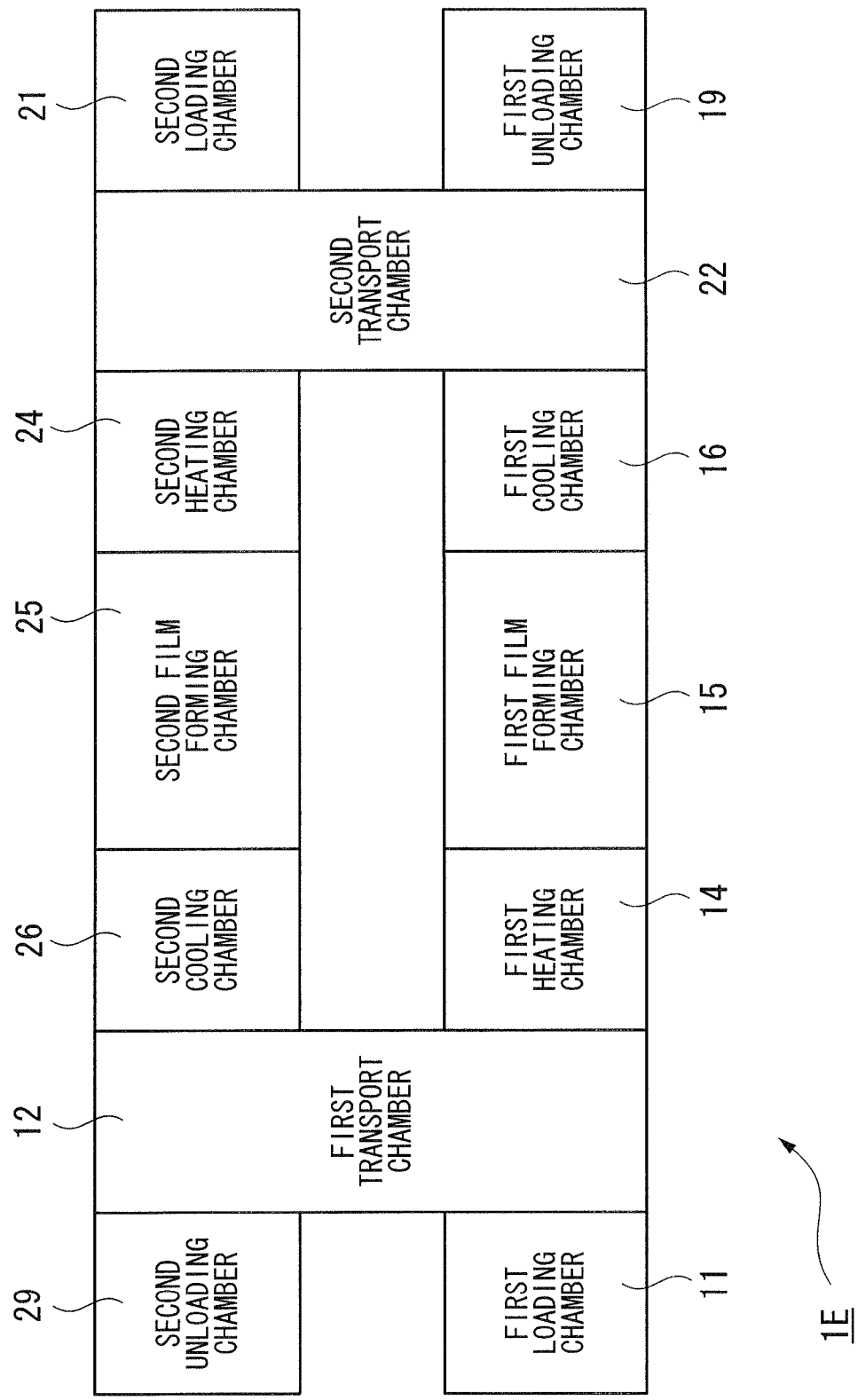
FIG. 9 is a plan view showing a schematic configuration of a vacuum processing apparatus according to a fifth embodiment of the present invention.

FIG. 9 is a plan view showing a schematic configuration of a vacuum processing apparatus according to a fifth embodiment of the present invention. The descriptions of the same elements as the above-mentioned embodiments are omitted.

In a vacuum processing apparatus 1E according to the fifth embodiment, a first cooling chamber (cooling chamber) 16 is disposed on a downstream side of the first film forming chamber 15. The first cooling chamber 16 serves to cool a substrate having been subjected to a film forming process by the first film forming chamber 15. The cooling method may be a compulsory cooling process in which cooling plates are disposed to face the front and rear surfaces of the substrate or a natural cooling process. Similarly, a second cooling chamber (cooling chamber) 26 is connected to a downstream side of the second film forming chamber 25. An illustration of a vacuum circulation path is omitted in FIG. 9.

In the vacuum processing apparatus 1E according to the fifth embodiment, similarly to the vacuum processing apparatus 1D according to the fourth embodiment, a substrate loading chamber and a substrate unloading chamber are separated. In this case, it is difficult to allow the second transport chamber 22 to serve as a cooling chamber (the same is true of the first transport chamber 12) since the second loading chamber 21 is connected to a downstream side of the second transport chamber 22 and the first unloading chamber 19 is connected to an upstream side of the second transport chamber 22. Therefore, by providing a cooling chamber on the downstream side of the film forming chamber, it is possible to reliably cool the substrate having been subjected to a film forming process.

(Sixth Embodiment)

Figure 10:
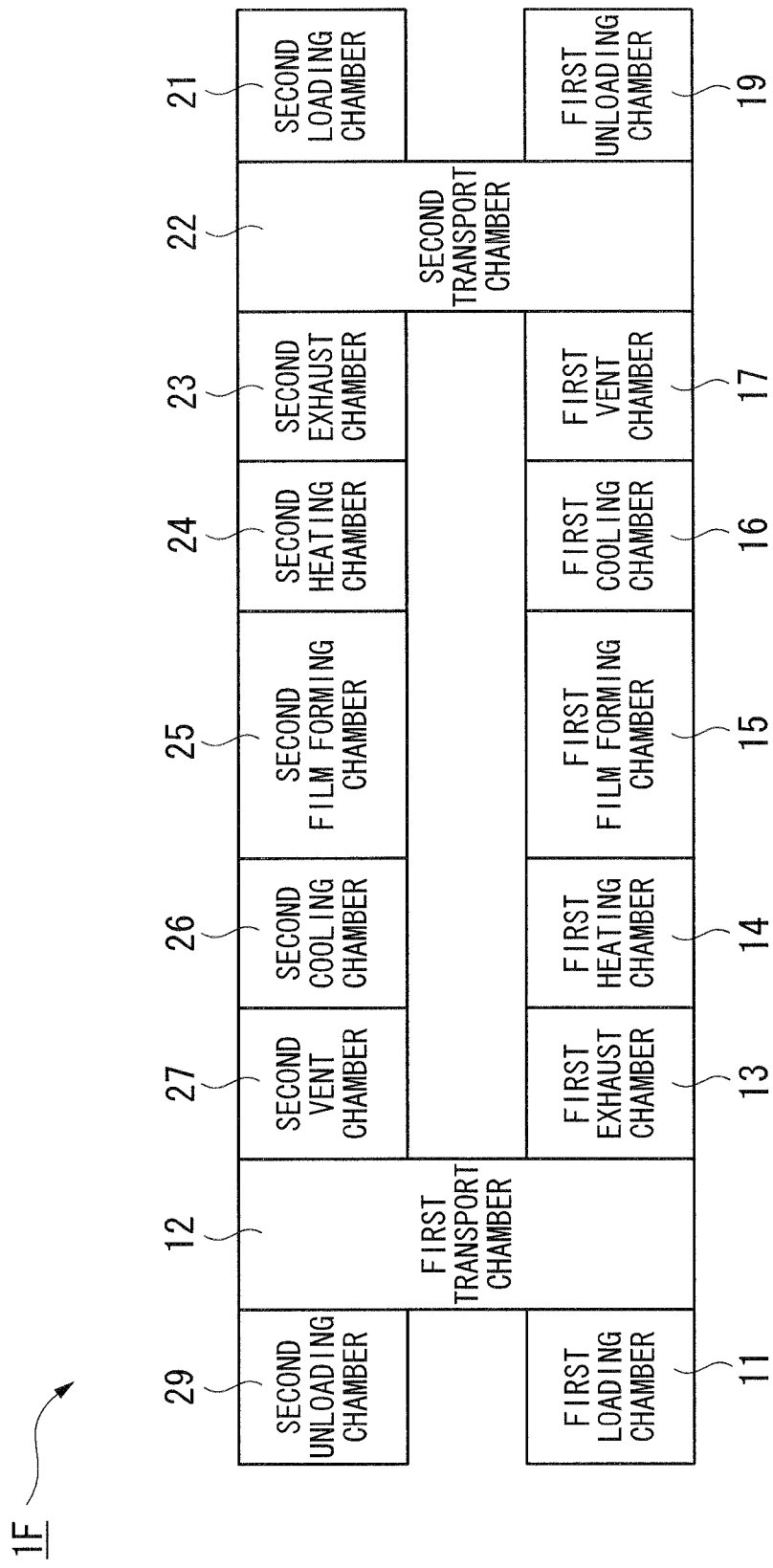
FIG. 10 is a plan view showing a schematic configuration of a vacuum processing apparatus according to a sixth embodiment of the present invention.
Figure 11:
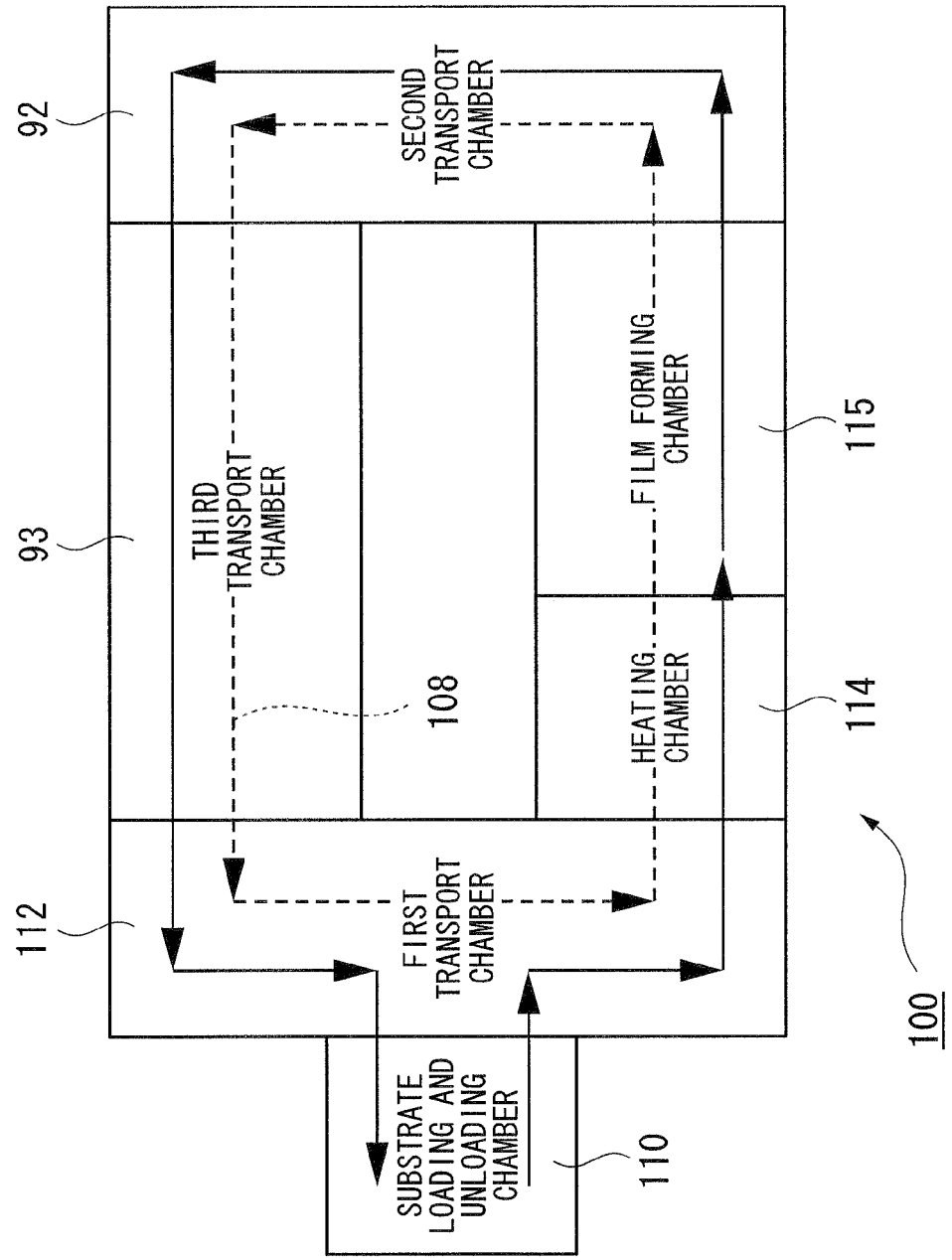
FIG. 11 is a plan view showing a schematic configuration of a known vacuum processing apparatus.

FIG. 10 is a plan view showing a schematic configuration of a vacuum processing apparatus according to a sixth embodiment of the present invention. The descriptions of the same elements as the above-mentioned embodiments are omitted.

In a vacuum processing apparatus 1F according to the sixth embodiment, a first exhaust chamber 13 is connected between the first transport chamber 12 and the first heating chamber 14 via valves. A first vent chamber 17 is connected between the first cooling chamber 16 and the second transport chamber 22 via valves. The first exhaust chamber 13 and the first vent chamber 17 each has a vacuum pump and can be evacuated the inside. On the contrary, no vacuum pump is connected to the first loading chamber 11 and the first unloading chamber 19. Similarly, a second exhaust chamber 23 is connected between the second transport chamber 22 and the second heating chamber 24 via valves. A second vent chamber 27 is connected between the second cooling chamber 26 and the first transport chamber 12 via valves. An illustration of a vacuum circulation path is omitted in FIG. 10.

The insides of the first transport chamber 12 and the second transport chamber 22 are kept in a controlled atmosphere. Here, the "controlled atmosphere" means an atmosphere in which partial pressures of the moisture and the carbon acid gas are suppressed, that is, a vacuum state, CDA (Clean Dry Air), or an atmosphere of inert gas such as $N_2$. The space between the first exhaust chamber 13 to the first vent chamber 17 and the space between the second exhaust chamber 23 to the second vent chamber 27 are kept in a vacuum. That is, the circulation path of a carrier is kept in the "controlled atmosphere" in which the partial pressures of the moisture and $CO_2$ are suppressed. Accordingly, the MgO film formed on a carrier does not adsorb the moisture or $CO_2$. In addition, since the insides of the first transport chamber 12 and the second transport chamber 22 having a large volume need not be kept in a vacuum, it is possible to greatly reduce the installation cost and the production cost.

In the vacuum processing apparatus 1F according to this embodiment: the substrate loading chamber serving as a load lock chamber in the vacuum processing apparatus 1D according to the fourth embodiment is divided into a mere substrate loading chamber and an exhaust chamber; and the substrate unloading chamber serving as an unload lock chamber in the vacuum processing apparatus 1D according to the fourth embodiment is divided into a mere substrate unloading chamber and a vent chamber. Accordingly, the loading of a substrate to a carrier in the substrate loading chamber and the vacuumizing of the exhaust chamber in which another carrier is placed can be simultaneously performed by the use of the circulating carriers. Therefore, it is possible to shorten the tact time compared with the vacuum processing apparatus 1D according to the fourth embodiment in which the load lock chamber having one carrier placed therein is evacuated and then a substrate is loaded to the same carrier. The unloading of a substrate from a carrier in the substrate unloading chamber and the vacuumizing of the vent chamber having another carrier placed therein can be simultaneously performed by the use of the circulating carriers. Accordingly, compared with the vacuum processing apparatus 1D according to the fourth embodiment in which a substrate is unloaded and then the vacuumization is performed in the unload lock chamber having one carrier placed therein, it is possible to shorten the tact time. Accordingly, it is possible to improve the throughput.

The technical scope of the present invention is not limited to the above-described embodiments, but is to be construed to include various modifications of the embodiments without departing from the spirit of the present invention.

That is, detailed materials, constructions and so on described and shown in the embodiments are only by way of an example, but may be modified in various ways.

For example, although it has been described in the above-mentioned embodiments that various processes are performed on a substrate horizontally held by a carrier, the present invention may be applied to a case in which various processes are performed on a substrate vertically held by a carrier. In addition, it has been described in the above-mentioned embodiments that the vacuum circulation path is constructed in two dimensions; however, the present invention may be applied to a case in which the vacuum circulation path is constructed in three dimensions. Furthermore, although it has been described in the above-mentioned embodiments that an electron beam deposition process is performed by the vacuum processing chamber, the present invention may be applied to a case in which a sputtering film forming process is performed by the vacuum processing chamber.

INDUSTRIAL APPLICABILITY

The present invention can be suitably used as a vacuum processing apparatus to be used in a method of manufacturing a plasma display panel.

What is claimed is:

1. A vacuum processing apparatus comprising:
a plurality of carriers to be mounted with a base member;
a circulation path which is kept in a CDA (Clean Dry Air) atmosphere and through which the carriers circulate;
a first and a second transport chambers which are disposed in the circulation path and which transport the carriers;
a plurality of base member loading and unloading chambers which are connected to the circulation path and which load and unload the base member to and from the carriers, the plurality of base member loading and unloading chambers including a first and a second base member loading and unloading chambers; and a plurality of vacuum processing chambers for attaching an film forming material to the substrate mounted on the carriers through a window portion of the circulation path, the plurality of vacuum processing chambers being disposed between the plurality of base member loading and unloading chambers in the circulation path respectively, the plurality of vacuum processing chambers including a first vacuum processing chamber, a second vacuum processing chamber, and a deposition chamber below the circulation path, wherein:

the first base member loading and unloading chamber which loads and unloads the base member is connected to the first transport chamber and to the circulation path at an outer side thereof; and the second base member loading and unloading chamber which loads and unloads the base member is connected to the second transport chamber and to the circulation path at the outer side thereof;

partial pressures of a moisture and a carbon acid gas are suppressed in the CDA (Clean Dry Air) atmosphere;

the first transport chamber is disposed on a downstream side of the first vacuum processing chamber and on an upstream side of the second vacuum processing chamber; and the second transport chamber is disposed on a downstream side of the second vacuum processing chamber and on an upstream side of the first vacuum processing chamber.

2. The vacuum processing apparatus according to claim 1, wherein a heating chamber for heating the base member is disposed on upstream sides of the vacuum processing chambers in the circulation path.

3. The vacuum processing apparatus according to claim 1, wherein a cooling chamber for cooling the base member is disposed on downstream sides of the vacuum processing chambers in the circulation path.

4. The vacuum processing apparatus according to claim 1, wherein
the first vacuum processing chamber and the second vacuum processing chamber are disposed to perform different processes.

5. The vacuum processing apparatus according to claim 1, wherein
a base member transport chamber is disposed on a downstream side of the first vacuum processing chamber and on an upstream side of the second vacuum processing chamber, and
the first base member loading and unloading chamber is disposed on an end of the first transport chamber close to the second vacuum processing chamber.

6. The vacuum processing chamber according to claim 5, wherein the transport chamber serves as a cooling chamber for cooling the base member before it is processed by the second vacuum processing chamber.

7. The vacuum processing apparatus according to claim 5, wherein the transport chamber serves as a heating chamber for heating the base member before it is processed by the second vacuum processing chamber.

8. The vacuum processing apparatus according to claim 5, wherein a base member loading chamber and a base member unloading chamber are separately disposed as the base member loading and unloading chamber.

9. The vacuum processing apparatus according to claim 1, wherein a base member loading chamber and a base member unloading chamber are separately disposed as the base member loading and unloading chamber.

* * * * *